United States Patent [19]
Munz et al.

[11] 4,011,398
[45] Mar. 8, 1977

[54] ELECTRICAL CONNECTION TO A CIRCUIT POTTED WITHIN A HOUSING AND METHOD OF SAME

[75] Inventors: Douglas B. Munz, Glenwood; William G. Skoda, Oak Park, both of Ill.

[73] Assignee: Motorola, Inc., Schaumburg, Ill.

[22] Filed: Mar. 3, 1975

[21] Appl. No.: 554,387

[52] U.S. Cl. .............................. 174/52 PE; 29/625; 29/627
[51] Int. Cl.² ......................................... H05K 1/08
[58] Field of Search ........................ 29/625–627; 174/68.5, 52; 317/101 R, 101 C, 101 CC, 101 CP, 101 A, 101 B; 264/272; 357/72, 74, 75, 80; 228/110, 177, 1

[56] References Cited
UNITED STATES PATENTS

| | | | |
|---|---|---|---|
| 3,161,843 | 12/1954 | Hodges et al. | 174/52 PE |
| 3,403,366 | 9/1968 | Klatte et al. | 174/52 PE X |
| 3,876,926 | 4/1975 | Schott et al. | 174/52 PE |

*Primary Examiner*—James R. Duzan
*Attorney, Agent, or Firm*—Donald J. Lisa; James W. Gillman

[57] ABSTRACT

An electrically conductive terminal having a connecting end and a mating end is affixed to a terminal assembly, the resultant subassembly placed within a housing containing a circuit board. The subassembly is located to effect electrical connection between the connecting end of the terminal and a pad on the circuit board, and to position the mating end externally to the volume to be potted. Connection between the terminal and the pad is reinforced by a solder flow technique. A potting material fills the housing encapsulating the circuit board and terminal assembly.

16 Claims, 1 Drawing Figure

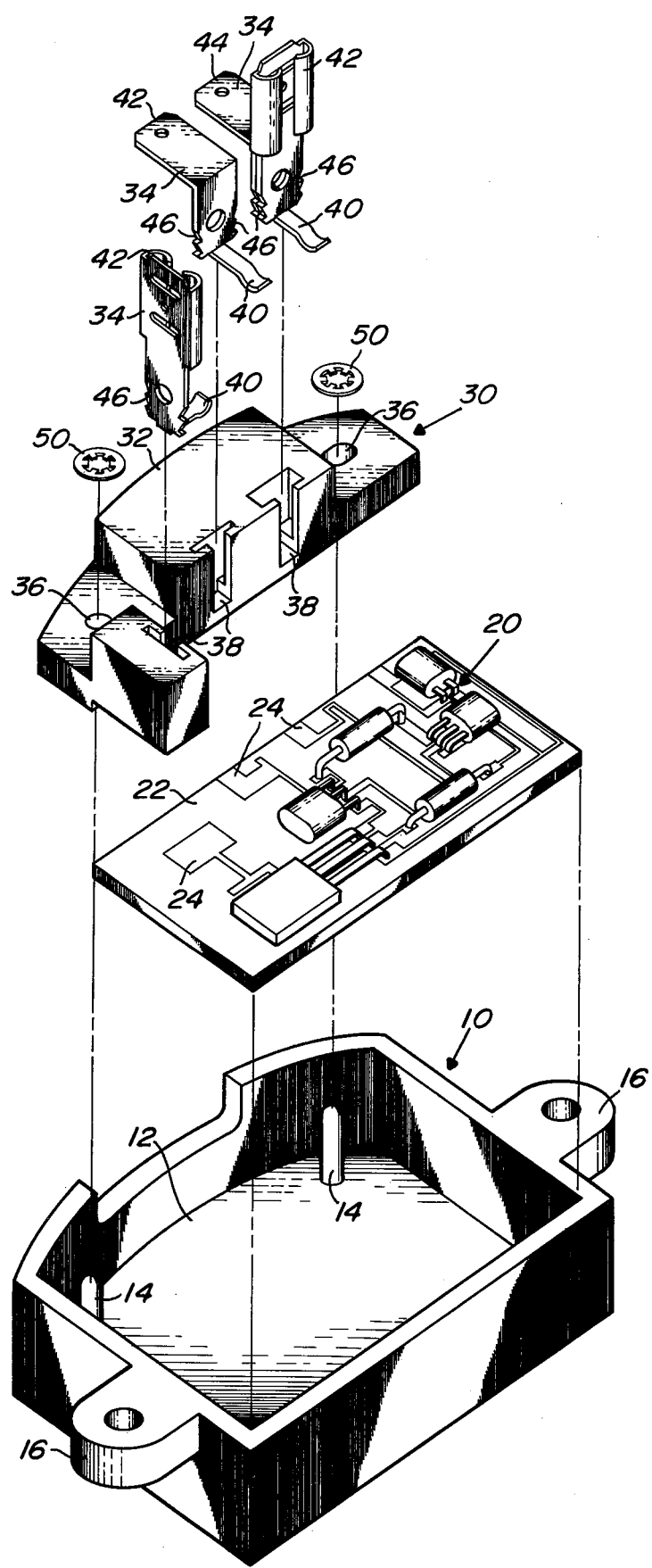

ELECTRICAL CONNECTION TO A CIRCUIT POTTED WITHIN A HOUSING AND METHOD OF SAME

BACKGROUND OF THE INVENTION

This invention relates to modules comprised of circuit boards encapsulated in housings and, more particularly, to a means for providing electrical terminals to such modules.

The encapsulation of circuits within housings via a potting material has advantages well known in the art. The resultant unit, or module, is mechanically durable. Moreover, the fragile circuit components are isolated from atmospheric contamination.

A problem arises with such modules when an electrical connection is required from the circuit to an element external to the encapsulation. If the package is to maintain its hermiticity, the connection must adapt to provide sealant properties.

Commonly, such a connection is accomplished by a wire, one end of which connects to the circuit, the remaining end extending out of the package. The potting process seals around the wire, thus preventing an unwanted leak. Interconnection wires prove deleterious to mass production techniques as they must be properly suspended during the potting process and require special handling both to test and, ultimately, to install. Furthermore, as wire interconnects are mechanically affixed to the module principally via the encapsulation, when the wires are mechanically stressed, as during test, installation, or other handling, wire breakage or seal degradation may result, either of which has severe consequences to the unit.

SUMMARY OF THE INVENTION

It is an object of the present invention, therefore, to provide an electrical connection to a circuit encapsulated within a housing which is mechanically strong, retains the isolation properties of the encapsulation, and which is easy to manufacture, test, and install.

Briefly, the process according to the instant invention, requires the steps of locating a circuit within a module housing, affixing an electrically conductive terminal connector, having a connecting end and a mating end, to a subassembly, locating the subassembly within the housing whereby the connecting end of the terminal is within the volume to be potted and the mating end of the terminal is located in a position to avoid being encapsulated, forming an electrical connection between the connecting end of the terminal and the desired point in the circuit, and filling the housing to a given level with the potting material.

BRIEF DESCRIPTION OF THE DRAWING

The figure is a detail showing the component parts to a module and the interconnection of the parts.

DETAILED DESCRIPTION OF THE PREFERRED EMBODIMENT OF THE INVENTION

As is illustrated in the figure, the module is comprised of a housing 10 provided with a trough 12 with two predeterminedly located cylindrical blunt-nosed studs 14 extending in a direction substantially perpendicular to the base of the trough. Extending from either side of the housing 10 are mounting ears 16, each of which is provided with a mounting hole.

A circuit 20 includes a plurality of electronic components soldered to a series of metal runs provided on the surface of a ceramic substrate 22. The substrate is also provided with metal pads 24 which are electrically connected to those parts of the circuit 20 requiring interconnection external to the total unit. The first step in constructing the module requires locating the circuit within the housing. As is shown, the circuit is located such that the pads 24 are accessible from above.

Next, a subassembly 30 is constructed which is comprised of a terminal assembly 32 and a series of terminals 34. The terminal assembly is formed of a plastic material, preferably Valox, and is provided with mounting holes 36 and positioning slots 38. The mounting holes are in a predetermined, spaced relationship to be penetrated by both studs 14. Positioning slots 38 are located to provide access to the metal pads 24 on the circuit 20. Each terminal 34 is comprised of a conductive material having a connecting end 40 and a mating end 62. A second mating terminal 44 is shown affixed to a mating end 42 via either a rivet or solder. Also provided in the terminals 42 are cutouts which result in pointing engaging faces 46.

The subassembly 30 is constructed as follows. The connecting end 40 of each terminals 42 is located within a respective positioning slot 38 of terminal assembly 32 such that the pointed engaging faces 46 are snug to the walls of the slots 38. An ultasonic welder is applied to the terminal assembly 32 causing it to liquify and form around the pointed engaging faces 46 of the terminals 34. Thus, the terminals are affixed to the terminal assembly.

The subassembly 30 is located in the housing such that the studs 14 engage the mounting holes 36, thereby aligning the subassembly 30 within the housing. Alignment is also provided by forming the subassembly to conform to the housing walls. To secure the subassembly to the foot of the housing washers 50 are forced over the studs 14 and against the subassembly 30. The subassembly is registered via the above alignment means with respect to the circuit such that the connecting end 40 of each terminal 34 engages a corresponding pad 24 on the circuit 20 whereby an electrical connection is made therebetween. Also, the mating end 42 of each terminal is located to be external to the volume which will later be potted. With the connecting end 40 in place over the pads 24 the entire assembly may be solder-flowed such that a reinforced connection is made between connecting ends 40 and pads 24.

Finally, a potting material is poured into the housing 10 to a level whereby the circuit 20 and terminal assembly 32 are encapsulated but the mating end 42 of each terminal is external to the encapsulation.

Since the terminals 34 are all affixed to the terminal assembly 32 and the terminal assembly is encapsulated within the housing 10 each terminal is firmly anchored to the assembly. Further, the process of potting the assembly creates a seal around the terminal which maintains the isolation integrity of the package. Finally, the subassembly structure is easy to manufacture and results in a module which is easy to test, install, or otherwise handle.

While a preferred embodiment of the invention has been disclosed, many variations thereof are possible, all of which are within the true spirit and scope of the invention.

What we claim is:

1. A circuit potted within a housing unit wherein the improvement comprises
   a subassembly having a terminal and a terminal assembly,
   the terminal of electrically conductive material and having a connecting end and a mating end,
   the terminal affixed to the terminal assembly,
   the subassembly located in the housing via aligning means for positioning the connecting end within the potting material in electrical contacting engagement with a selected portion of the circuit and a mating end external to the potting material,
   whereby electrical connection to the mating end effects electrical contact to the circuit.

2. The unit of claim 1 wherein the circuit includes electrical components affixed to conductors on a ceramic substrate, the substrate provided with conducting pads suitable for connection to the connecting end of the terminal.

3. The unit of claim 1 wherein the terminal assembly is potted within the housing.

4. The unit of claim 1 wherein the terminal is ultrasonically welded to the terminal assembly.

5. The unit of claim 2 wherein the connecting end is affixed to the pad via a solder flow technique.

6. The unit of claim 1 wherein a conductive member is soldered to the mating end.

7. The unit of claim 1 wherein the terminal is affixed to the subassembly prior to location of a subassembly within the housing.

8. The unit of claim 1 further comprising means to predeterminely locate and secure the circuit within the housing prior to locating the subassembly in the housing.

9. A method of providing an electrical connection to a circuit located in a housing and potted therein including the steps of:
   a. locating the circuit within the housing,
   b. affixing a conductive terminal connector, having a connecting end and a mating end to a terminal assembly, resulting in a subassembly,
   c. locating the subassembly within the housing via aligning means for positioning the connecting end to be located within the potting material in contacting engagement with a selected portion of the circuit and positioning the mating end to be located without the potting material,
   d. forming an electrical connection between the connecting end and the circuit, and
   e. potting the circuit and terminal assembly in the housing.

10. The method of claim 9 including the further steps of:
    a. constructing the circuit on the surface of a ceramic substrate, and
    b. providing a conductive pad on the substrate for connection to the connecting end.

11. The method of claim 9 wherein the affixing step further includes ultasonically welding the terminal to the subassembly.

12. The method of claim 10 wherein the forming step includes
    a. locating the connecting end to contact the pad, and
    b. solder flowing the ceramic surface.

13. The method of claim 9 including the further step of soldering a conductor to the mating end.

14. The method of claim 9 wherein the step of locating the subassembly within the housing via aligning means comprises the steps of:
    a. providing mounting holes in predetermined locations in the subassembly; and
    b. forming studs in the housing, the studs adapted for engaging the mounting holes and guiding the subassembly to a predetermined location within the housing for proper register with the circuit.

15. The method of claim 9 wherein the step of locating the subassembly within the housing via aligning means comprises the step of:
    forming the subassembly of predetermined dimensions with respect to the housing such that when the subassembly is located within the housing it conforms to the housing walls for proper register of the terminal connector connecting end with the selected circuit portion.

16. The method of claim 14 wherein the step of locating the subassembly within the housing via aligning means comprises the further step of:
    forming the subassmbly of predetermined dimensions with respect to the housing such that when the subassembly is located within the housing it conforms to the housing walls for proper register of the terminal connector connecting end with the selected circuit portion.

* * * * *